(12) United States Patent
Boulerne

(10) Patent No.: US 7,042,233 B1
(45) Date of Patent: May 9, 2006

(54) HARMONIC REJECTION TUNER

(75) Inventor: Philippe Boulerne, 6980 Lacroix, Ville Emard, Montreal, Quebec (CA) H4E 2V3

(73) Assignee: Philippe Boulerne, Montreal ( * ) Notice: Subject to any disclaimer, the term of this patent is extended or adjusted under 35 U.S.C. 154(b) by 0 days.

(21) Appl. No.: 11/114,407

(22) Filed: Apr. 27, 2005

(51) Int. Cl.
 *G01R 27/04* (2006.01)
(52) U.S. Cl. ...................... 324/642; 333/263
(58) Field of Classification Search ............ None
 See application file for complete search history.

(56) References Cited

U.S. PATENT DOCUMENTS 6,297,649 B1 * 10/2001 Tsironis ............... 324/642
6,674,293 B1 * 1/2004 Tsironis ............... 324/638

* cited by examiner

*Primary Examiner*—Vincent Q. Nguyen

(57) ABSTRACT

The present invention discloses a harmonic rejection tuner system consisting of a radio-frequency (RF) or microwave transmission line having a longitudinal axis, containing at least one harmonic resonator sliding on the central conductor, said harmonic resonator is a pair of shorted-stubs, said shorts are adjustable, making the electromagnetic length of the shunt shorted-stubs variable, therefore making the resonant frequency of the harmonic resonator variable. The harmonic resonator will reflect a harmonic frequency nF0 of a base frequency F0. The harmonic rejection tuner of this invention has an input and output, and is connected in series between the DUT and the large band fundamental tuner.

16 Claims, 9 Drawing Sheets

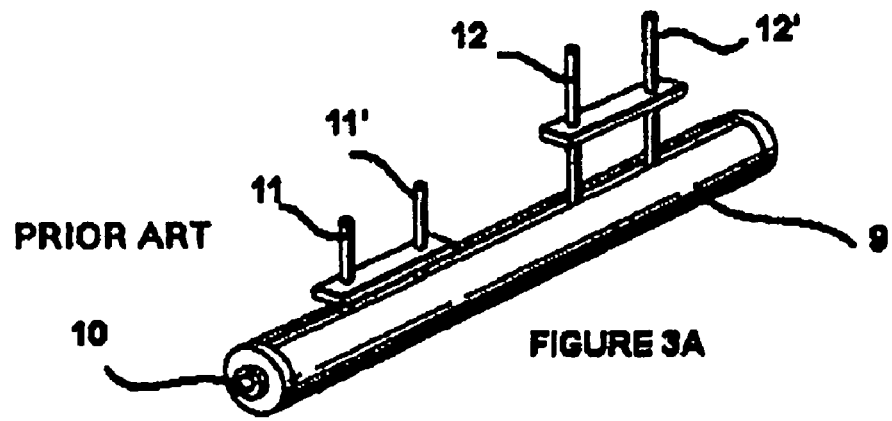
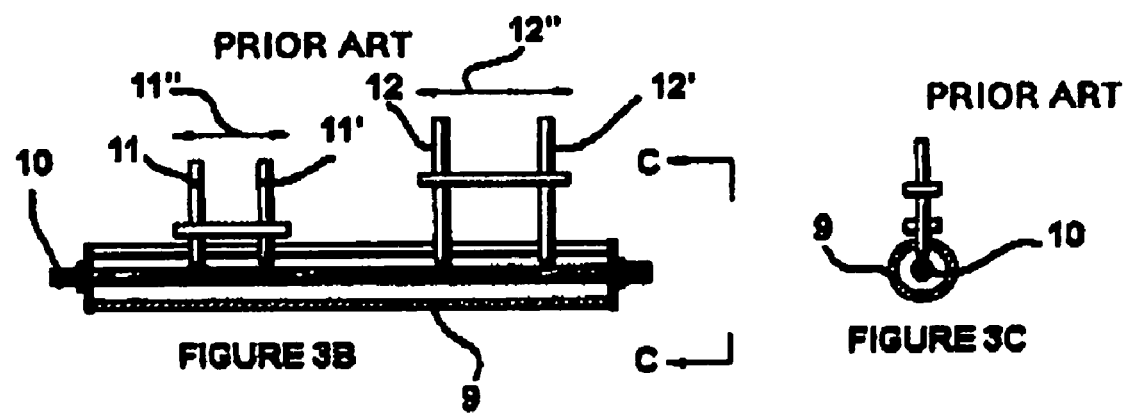
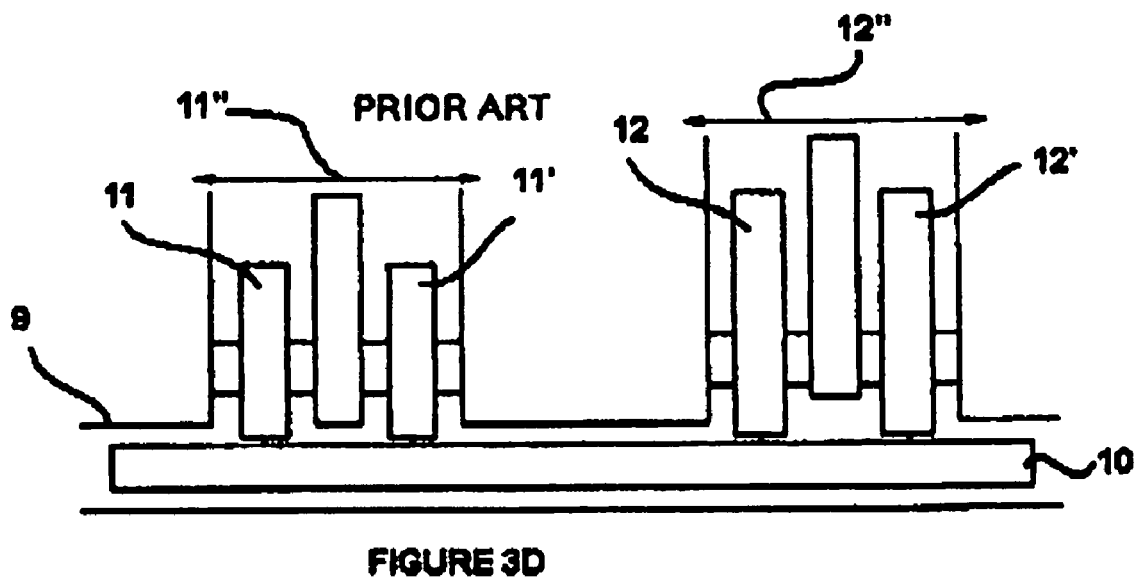

HARMONIC REJECTION TUNER

CROSS REFERENCE TO RELATED APPLICATIONS

U.S. Patent Documents

| 6297649 | Oct. 2, 2001 | Tsironis | 324/642 |
| 6674293 | Jan. 6, 2004 | Tsironis | 324/638 |

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to an electromechanical harmonic rejection tuner system, and more particularly to such a system to be used in harmonic load-pull setup for the measurement, characterization and testing of RF or microwave devices. Under high power conditions at its input at the fundamental frequency F0, the device under test (hereinafter referred to as "DUT") generates an output signal that contains the fundamental frequency F0 and the harmonic frequencies of said fundamental frequency F0. RF/Microwave harmonic rejection tuners are electronic devices or mechanical devices which modify in a predictable way the phase of the reflection of harmonics of a given operation frequency F0. The harmonic rejection tuner has the capability of generating high amplitude gamma to the microwave devices at harmonic frequencies. This technique of subjecting DUT input and output to variable high gamma phase with corresponding harmonic source tuner and harmonic load tuner, commonly referred to as "harmonic load pull", is used to test transistors for amplifier, oscillator or frequency multiplier applications specially at high power, when the non-linear effects of the DUT produces harmonic frequencies.

2. Description of Prior Art

The harmonic load-pull setup is composed of an input generator and its associated amplification (1) connected to input fundamental tuner (2), input harmonic tuner (3), DUT (4), output harmonic tuner (5), output fundamental tuner (6) and the appropriated measurement apparatus (7).

One possible configuration for the harmonic tuner has been proposed in U.S. Pat. No. 6,297,649 issued to Christos TSIRONIS Oct. 2, 2001. These harmonic tuners are comprising a transmission line (9) on which 2 open-stubs (11,12) are sliding on the central conductor (10), which open-stubs are surrounded by a circular side wall (14,14') and permanently secured on the said side walls through dielectric, low loss washers (13,13'). The open-stubs are then positioned along the transmission line to control the phase of the reflection as indicated by arrows (11") and (12"). In order to eliminate the residual reflection at the fundamental frequency F0, additional open-stubs (11',12') might be added, said additional open-stubs are identical to the first open-stubs (11,12).

The problem remaining with this solution is that when the fundamental frequency F0 changes, the length of each of the open-stubs should be changed to reflect out the desired harmonic frequencies of the new fundamental frequency F0. Therefore, the harmonic rejection load-pull tuner of U.S. Pat. No. 6,297,649 is supplied as a kit with a plurality of open-stubs. Each open-stub is having a length adapted to reflect out an nth order harmonic nF0 of a given frequency F0. In order to solve that problem, U.S. Pat. No. 6,297,649 exposes the possibility of using open-stubs having a variable length to increase $\Delta f$. Plungers (100) can be used in order to make the open-stubs lengths (18,19) variables. This will however be accompanied by a decrease in the precision of the measurements, because of the difficulty in precisely adjusting the position of the plunger with the screw. Another drawback of open-stub plungers is that the characteristic impedance of the open-stub (18,19), defined by arrow (101), is different from the characteristic impedance of the plungers (100), defined by arrow (102), since the distances from the open-stubs and the plungers to the grounding walls (14,14') is necessarily different.

BRIEF SUMMARY OF THE INVENTION

The problem remaining in the prior art has been solved in accordance with the present invention which relates to a class of mechanical harmonic rejection load-pull and source-pull tuners comprising a transmission line, two harmonic resonators sliding along the transmission line longitudinal axis, which harmonic resonators are shunt shorted-stubs, said shorts are moveable along the shunt stub, making the rejected frequencies of the tuner adjustable.

BRIEF DESCRIPTION OF THE SEVERAL VIEWS OF THE DRAWING

FIG. 3A: Prior Art: depicts a double harmonic tuner with pair of open-stubs

FIG. 3B: Prior Art: depicts a double harmonic tuner pair of open-stubs—longitudinal cross sectional view.

FIG. 3C: Prior Art: depicts a double harmonic tuner with pair of open-stubs—transversal cross sectional view.

FIG. 3D: Prior Art: depicts a double harmonic tuner with pair of open-stubs—schematic longitudinal cross sectional view.

DETAILED DESCRIPTION OF THE INVENTION

Figure 1:
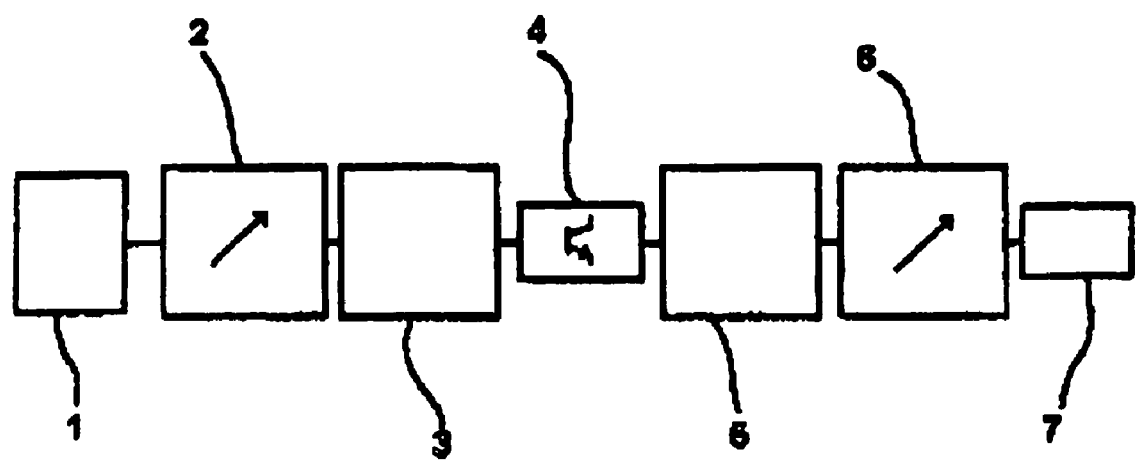
FIG. 1: Prior Art: depicts a schematic block diagram of a harmonic load-pull setup using harmonic tuners in series between the fundamental tuners and the DUT
Figure 2A:
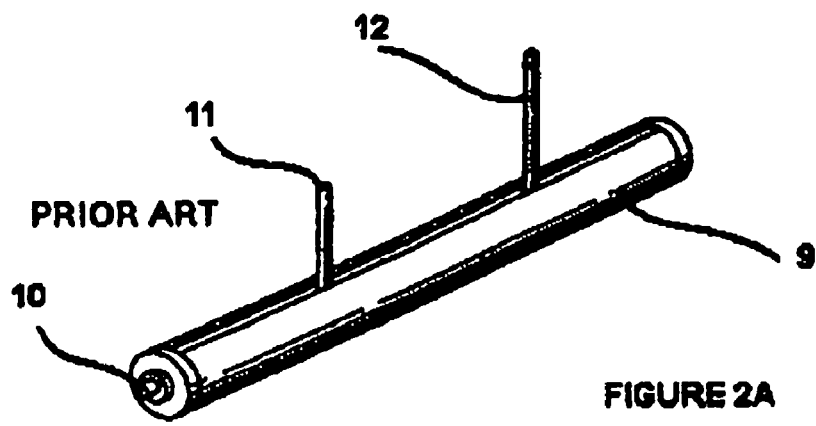
FIG. 2A: Prior Art: depicts a double harmonic tuner with open-stubs
Figure 2B:
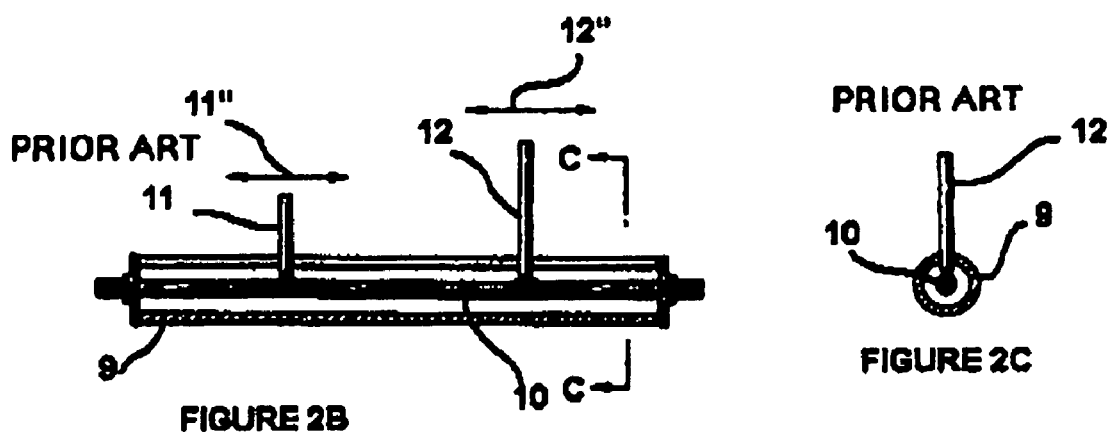
FIG. 2B: Prior Art: depicts a double harmonic tuner with open-stubs—longitudinal cross sectional view.
Figure 2C:
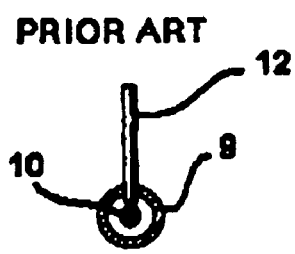
FIG. 2C: Prior Art: depicts a double harmonic tuner with open-stubs—transversal cross sectional view.
Figure 2D:
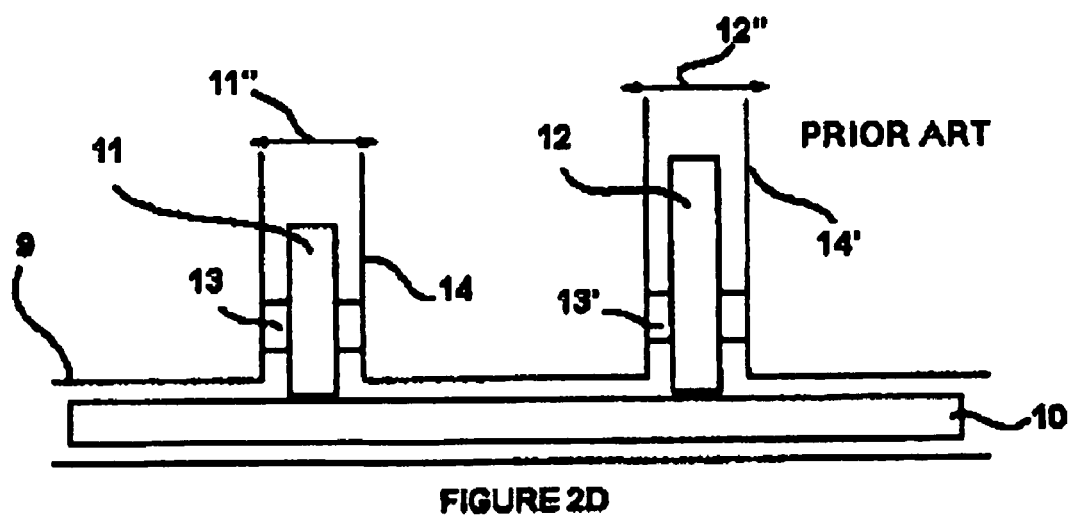
FIG. 2D: Prior Art: depicts a double harmonic tuner with open-stubs—schematic longitudinal cross sectional view.
Figure 4A:
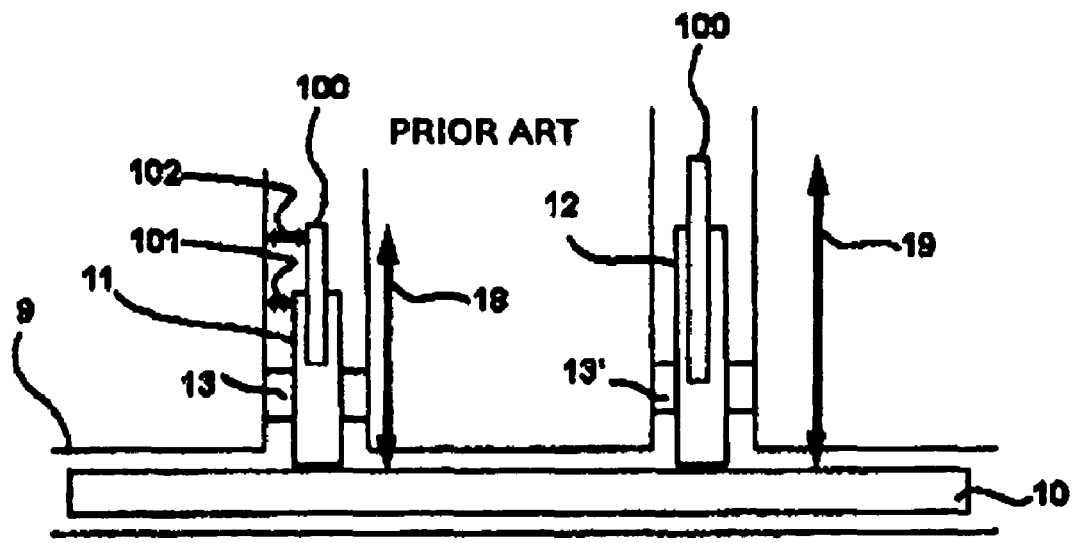
FIG. 4A: Prior Art: Depicts a double harmonic tuner with open-stubs with plungers.
Figure 4B:
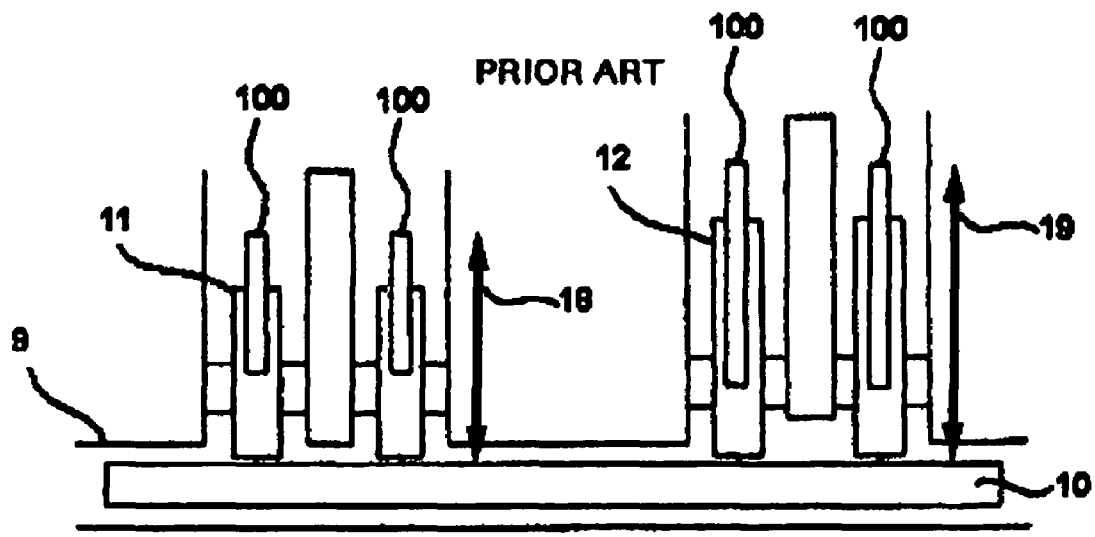
FIG. 4B: Prior Art: Depicts a double harmonic tuner with pair of open-stubs with plungers.
Figure 5A:
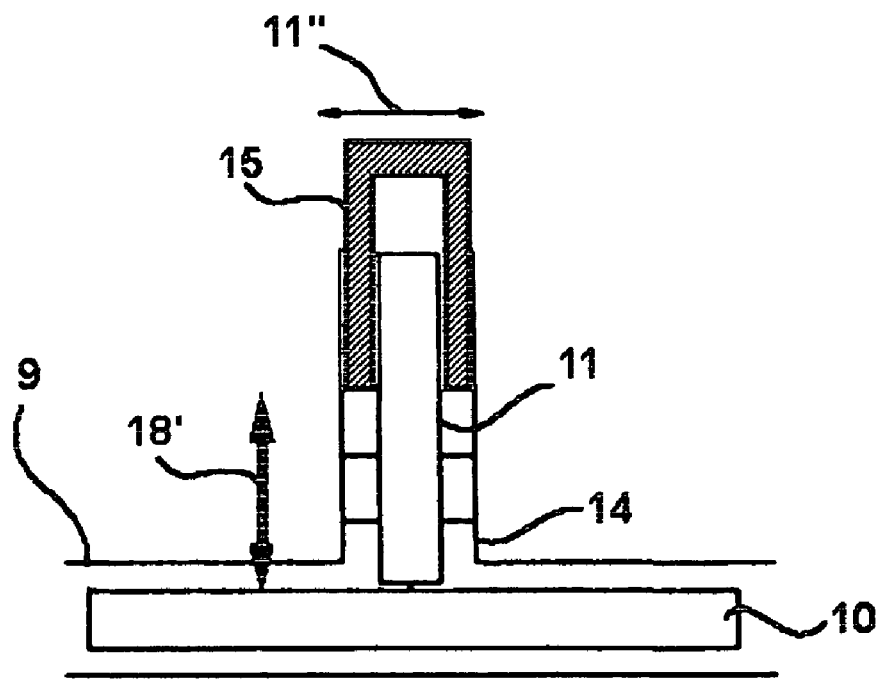
FIG. 5A: Depicts a single harmonic tuner with shorted-stubs.
Figure 5B:
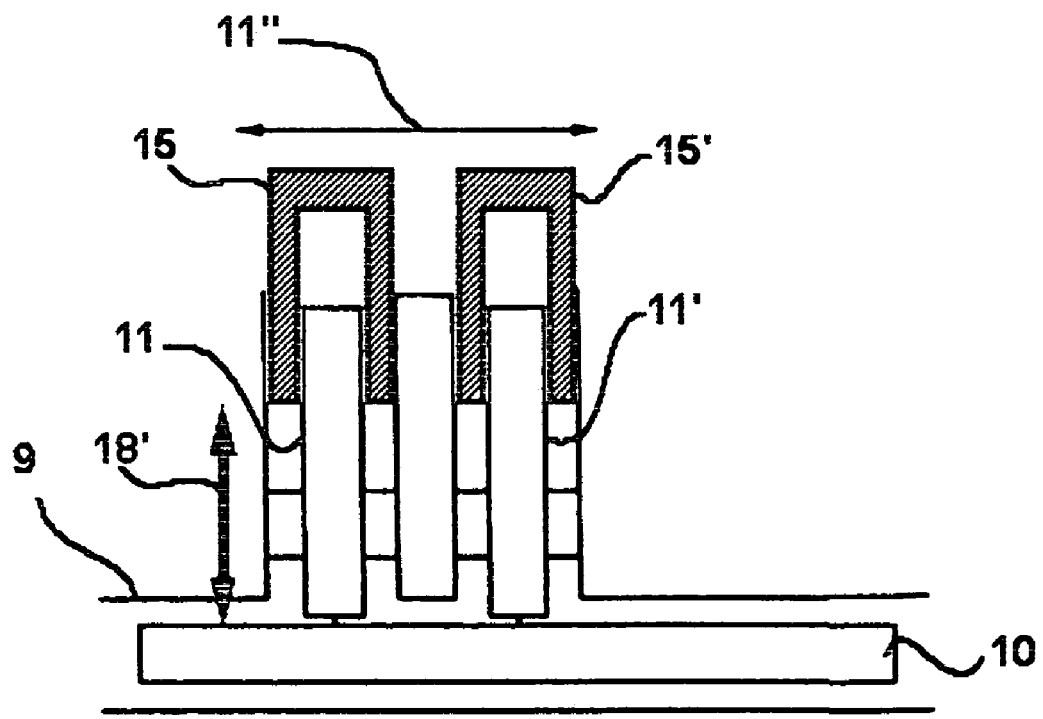
FIG. 5B: Depicts a single harmonic tuner with pair of shorted-stubs.
Figure 6A:
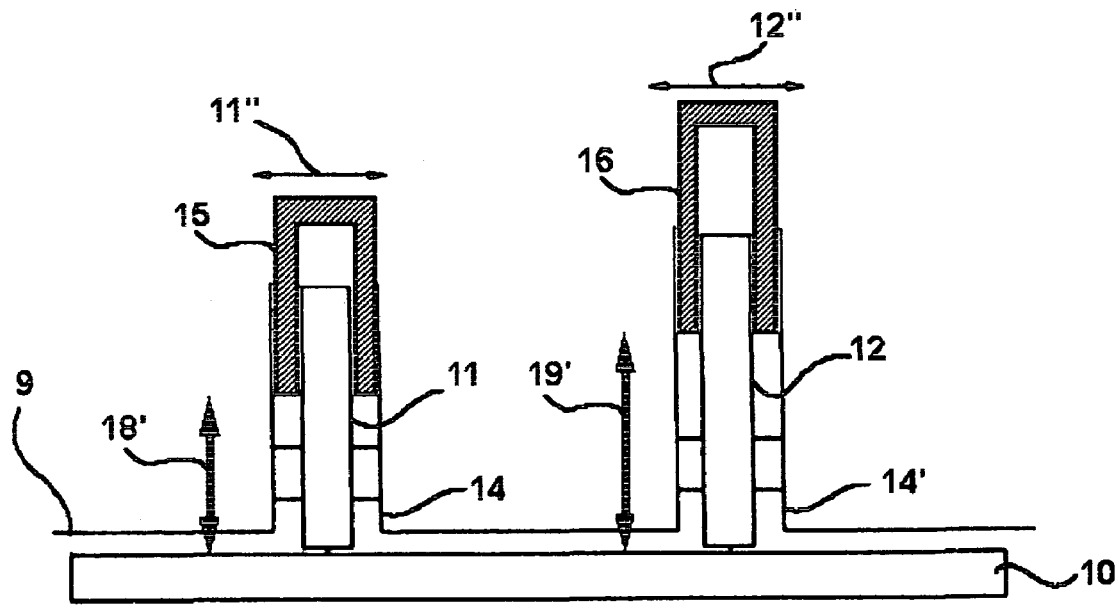
FIG. 6A: Depicts a double harmonic tuner with shorted-stubs.
Figure 6B:
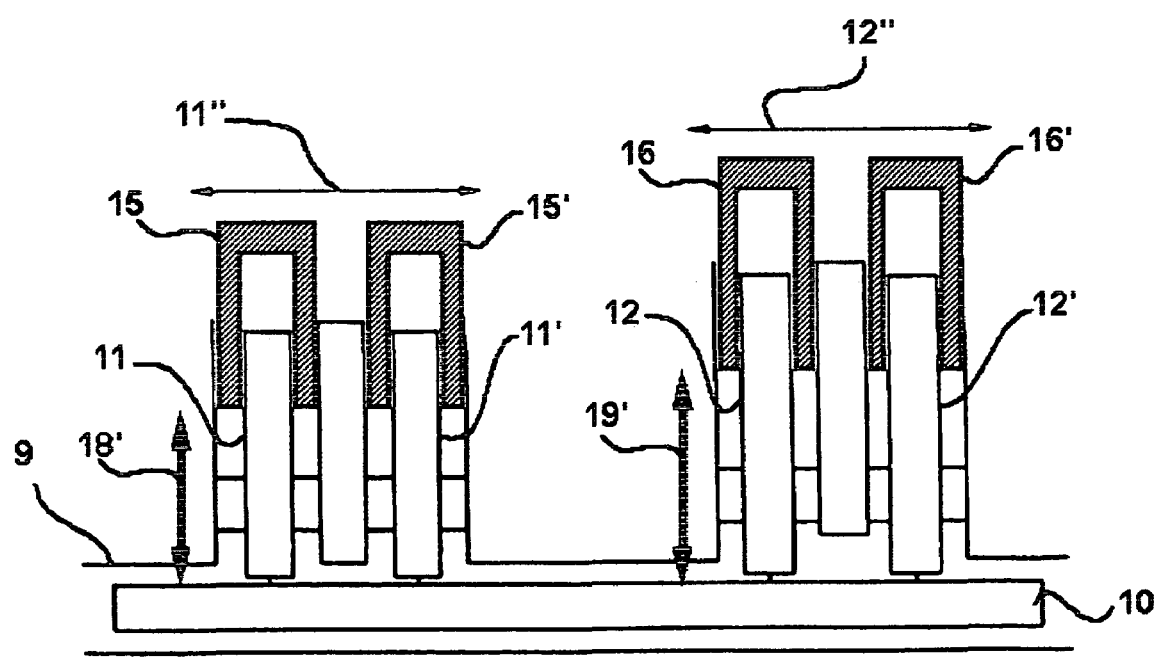
FIG. 6B: Depicts a double harmonic tuner with pair of shorted-stubs.

Referring to FIGS. 5A, 5B, 6A and 6B, the harmonic rejection tuner from this invention reflects back to DUT at least one of the harmonic frequencies nF0 of a fundamental frequency F0 with appropriate phase angle, said harmonic frequencies nF0 being adjustable with changes of F0.

Figure 7A:
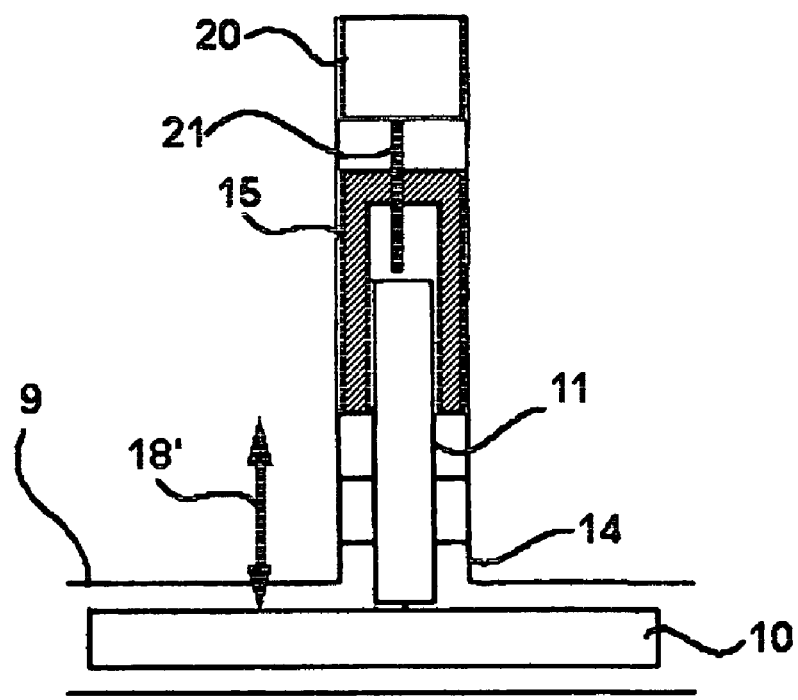
FIG. 7A: Depicts a single harmonic tuner with shorted-stubs which length is adjusted with motor.
Figure 7B:
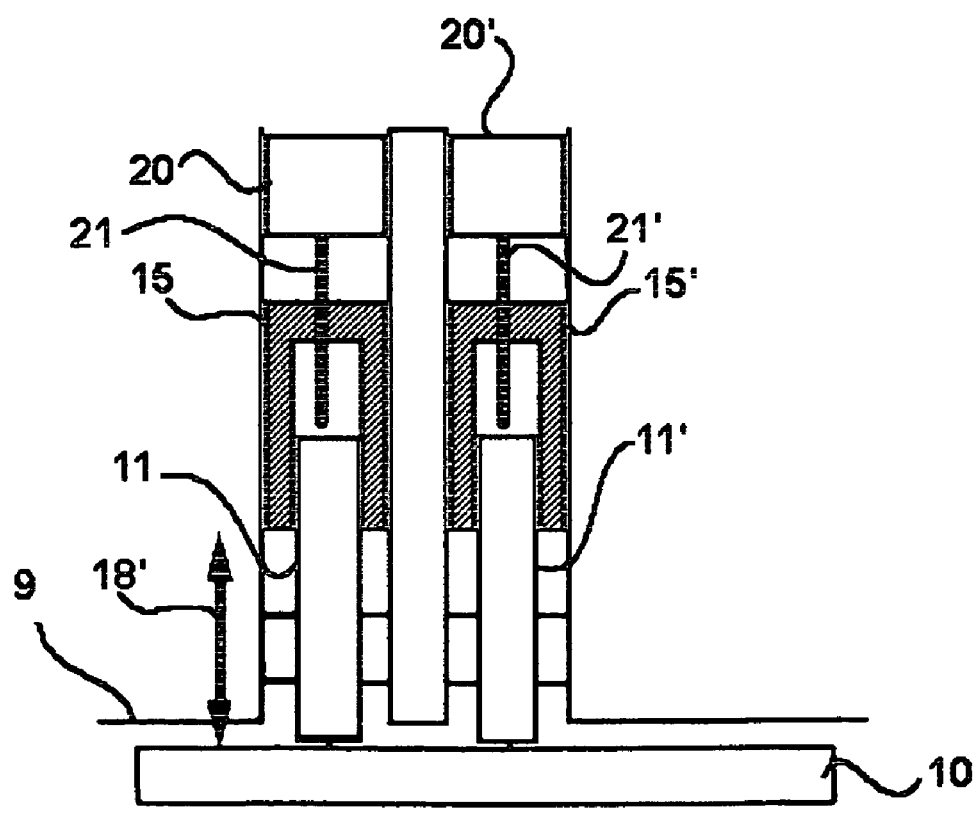
FIG. 7B: Depicts a single harmonic tuner with pair of shorted-stubs which length is adjusted with motors.
Figure 8A:
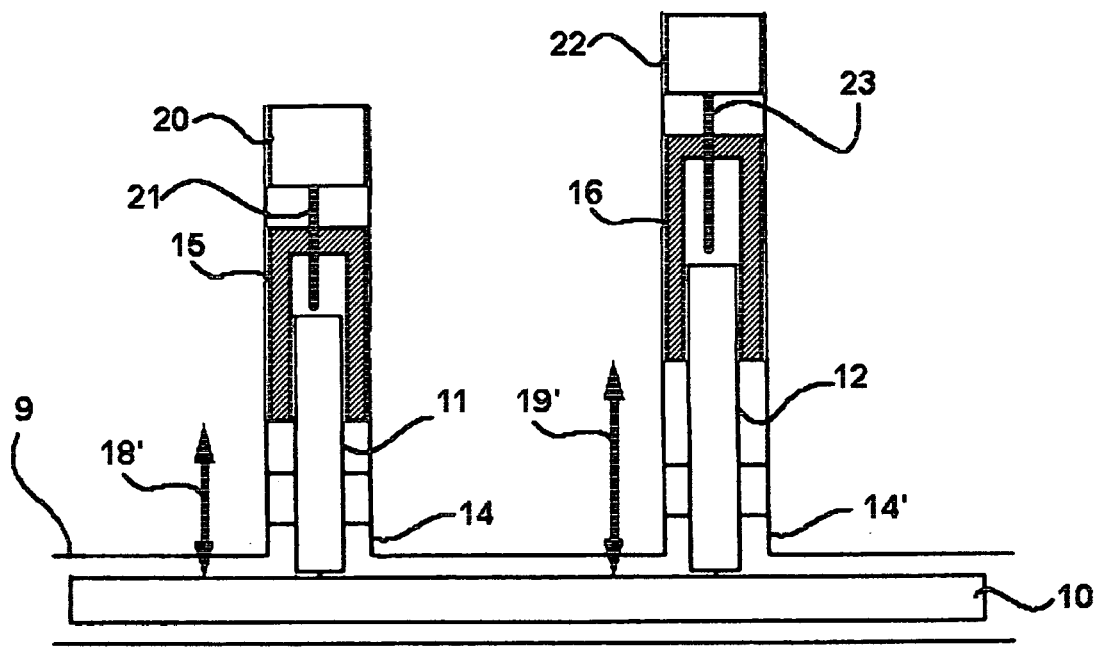
FIG. 8A: Depicts a double harmonic tuner with shorted-stubs which length is adjusted with motors.
Figure 8B:
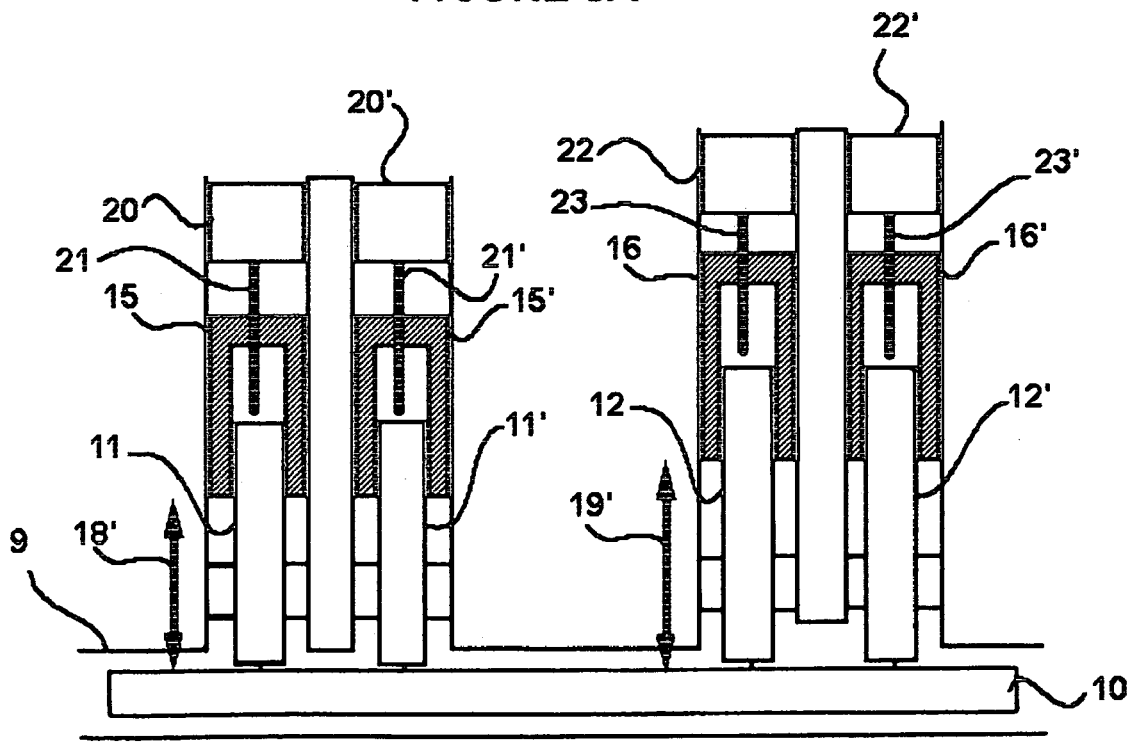
FIG. 8B: Depicts a double harmonic tuner with pair of shorted-stubs which length is adjusted with motors.
Figure 9:
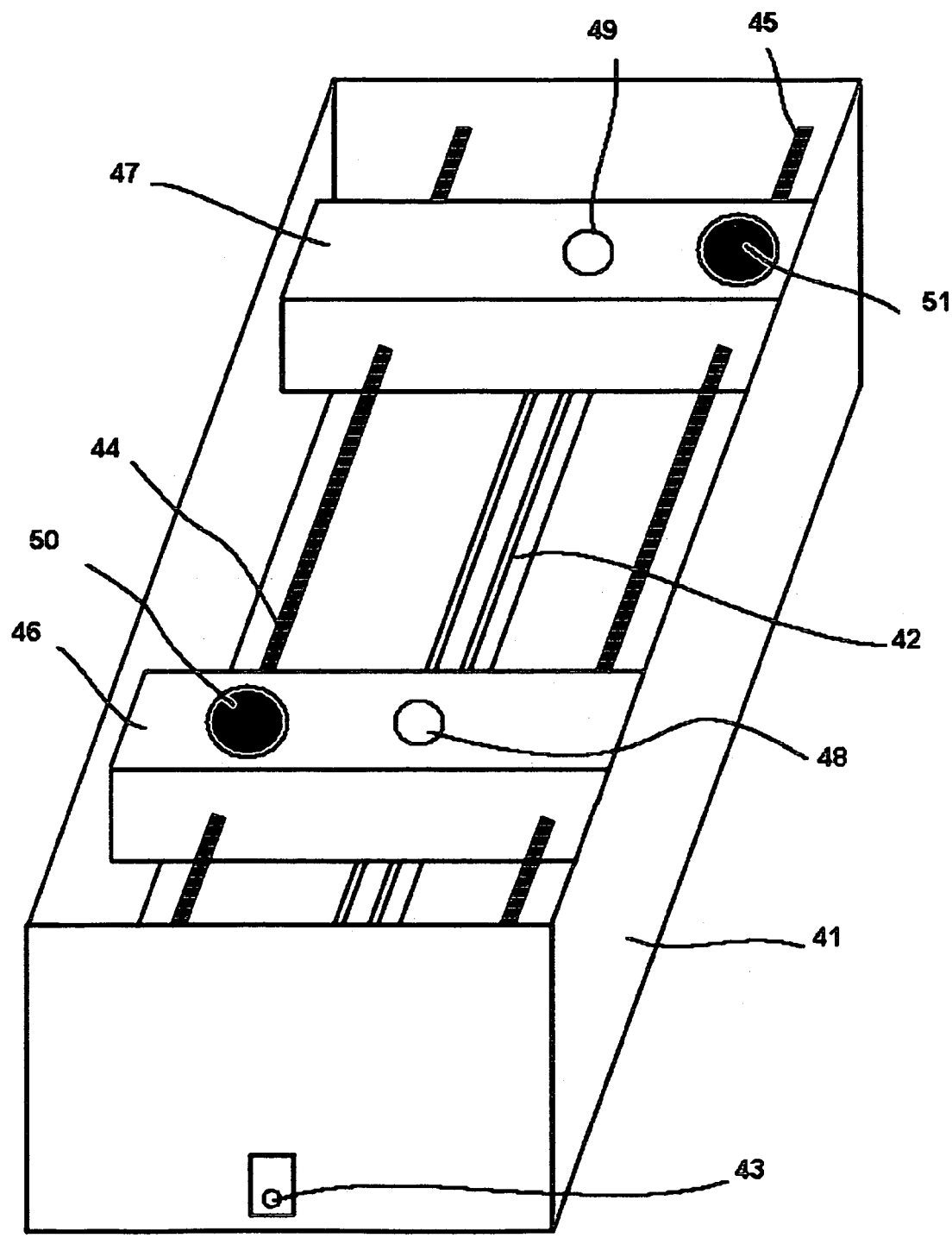
FIG. 9: Depicts a double harmonic rejection tuner arrangement—perspective view.

The harmonic rejection tuner, described by FIGS. 5A, 5B, 6A, 6B, 7A, 7B, 8A, 8B and 9, consists of a housing (41), a transmission line (9,42) with a characteristic impedance Z0. The transmission line contains two harmonic resonators (11,12,48,49), that slide between the inner (10,43) and outer (9) conductors. In a preferred embodiment of this invention, the harmonic resonators (11,12) include at least one coaxial resonators, each resonator being mechanically linked to a mobile carriage (46,47). The harmonic resonators are horizontally positioned in the transmission line by mobile carriages (46,47), which are driven by two lateral mechanisms such as driving screws (44,45), which themselves are controlled by stepping motors (50,51). Both harmonic resonators are sliding on the central conductor of the transmission line as depicted by arrows (11",12").

The harmonic resonators of this invention are shunt shorted-stubs, with a characteristic impedance half of the characteristic impedance of the transmission line (9,42). The electromagnetic-length of the shorted-stubs, depicted by arrows (18') and (19'), will determine the resonant frequency nF0 being rejected by the resonators. Appropriate means (15,16) to short the stubs (11,12) are provided. Perfect galvanic contact of the shorting means (15,16) has to be accomplished with both the shunt stubs (11,12) and the outer conductor (14,14'). In a preferred embodiment of this invention, the resonators are coaxial resonators, allowing the shorting means (15,16) to slide between the shunt stubs (11,12) and the outer conductor (14,14') which act as electrical ground, making the electromagnetic-length of the shunt stubs variable as depicted by arrows (18',19'). By varying the electromagnetic-length of the stubs (11,12) with the shorting means (15,16), the user can change the harmonic resonant frequency accordingly to any change of the fundamental frequency F0. The characteristic impedance of the shorted-stubs will stay constant when changing the electromagnetic-length (18',19').

In order to control the phase angle of the reflection, the harmonic resonators are moveable along the longitudinal axis of the transmission line (10,43), as shown by arrows (11") and (12"). An appropriate motor driven mechanism (50,51) ensures the controlled smooth travel of the harmonic resonators (11,12,11',12') along the longitudinal axis of the transmission line (10,43) and thus the control of the phase reflection generated by the harmonic resonators.

In a second preferred embodiment of this invention, identical shorted-stubs (11',12') to their corresponding shorted-stubs (11,12) are added with equal electromagnetic-length (18',19') arranged by shorting means (15',16') at a predetermined distance in order to eliminate residual unwanted reflection at the fundamental frequency F0. The said added shorted-stubs (11') and (12') being mechanically attached to respectively shorted-stubs (11) and (12) and are sliding on the central conductor (10,43) simultaneously.

In a third preferred embodiment of this invention, an appropriate motor driven mechanism (20,20',22,22') make the position of the shorting means adjustable through lead screws (21,21',23,23'), therefore making the change of the electromagnetic length (18',19') of the parallel stubs (11,11', 12,12') automated, requiring no manual operations.

Finally, expressions such as "equal" and "identical" have been used in the present description and in the following claims. However, it will be understood that these expressions, and other like them, are used in the context of theoretical calculations, but in practice mean "as close as possible" to the theory.

Although the present invention has been explained hereinabove by way of a preferred embodiment thereof, it should be pointed out that any modifications to this preferred embodiment within the scope of the appended claims is not deemed to alter of change the nature and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The embodiments of the invention in which an exclusive property or privilege is claimed are defined as follows:

1. A harmonic rejection load pull tuner comprising: means for reflecting at least one harmonic frequency of a base frequency F0, said means having an input and an output, said input being connected to an output of a device under test (DUT) and said output being connected to the input of large-band tuner, where said means for reflecting at least one harmonic frequency is comprising: a transmission line having a longitudinal axis and at least one shorted-stub in parallel with said transmission line, said shorted-stub being electrically connected to said transmission line and having a shorting means electrically connected to said shorted-stub and electrically connected to ground in order to adapt electromagnetic length of said shorted-stub to reflect out an nth order harmonic of a base frequency, where n is an integer greater than 1.

2. A harmonic rejection load pull tuner according to claim 1, wherein said at least one shorted-stub is moveable along said transmission line.

3. A harmonic rejection load pull tuner according to claim 2, where said at least one shorted-stub moveable along said transmission line is controlled by remote electrical means, said remote electrical means comprises at least one electrical motor.

4. A harmonic rejection load pull tuner according to claim 2, wherein said means for reflecting at least one harmonic frequency include two moveable shorted-stubs, each of said shorted-stubs being in parallel with said transmission line and longitudinally spaced apart from each other, a first shorted-stub having an electromagnetic length adapted to reflect out a second order harmonic and a second shorted-stub having a electromagnetic length adapted to reflect out a third order harmonic.

5. A harmonic rejection load pull tuner according to claim 2, wherein said transmission line is a slabline of characteristics impedance Z0.

6. A harmonic rejection load pull tuner according to claim 2, wherein said at least one moveable shorted-sub is a coaxial resonator of characteristics impedance Z0/2 and has a length approximately equal to $\lambda/2$ at nF0.

7. A harmonic rejection load pull tuner according to claim 2, wherein at least one of said at least one moveable shorted-stub further includes another resonator adapted to compensate the effect of the corresponding moveable shorted-stub on the reflection factor at the base frequency F0, said other resonator having a configuration identical to the corresponding moveable shorted-stub and being mechanically attached thereto.

8. A harmonic rejection load pull tuner according to claim 2, where said shorted-stubs grounding means are controlled by remote electrical means, said remote electrical means comprises at least one electrical motor.

9. A harmonic rejection source pull tuner comprising: means for reflecting at least one harmonic frequency of a base frequency F0, said means having an input and an output, said input being connected to the out of large-band tuner, and said output being connected to an input of a device under test (OUT), where said means for reflecting at least one harmonic frequency comprising: a transmission line having a longitudinal axis and at least one shorted-stub in parallel with said transmission line, said shorted-stub being electrically connected to said transmission line and having a shorting means electrically connected to said shorted-stub and the electrically connected to ground in order to adapt electromagnetic length of said shorted-stub to reflect out an nth order harmonic of a base frequency, where n is an integer greater than 1.

10. A harmonic rejection source pull tuner according to claim 9, wherein said at least one shorted-stub is moveable along said transmission line.

11. A harmonic rejection source pull tuner according to claim 10, where said at least one shorted-stub moveable along said transmission line is controlled by remote electrical means, said remote electrical means comprises at least one electrical motor.

12. A harmonic rejection source pull tuner according to claim 10, wherein said means for reflecting at least one harmonic frequency include two moveable shorted-stubs, each of said shorted-subs being in parallel with said transmission line and longitudinally spaced apart from each other, a first shorted-stub having an electromagnetic length adapted to reflect out a second order harmonic and a second shorted-stub having an electromagnetic length adapted to reflect out a third order harmonic.

13. A harmonic rejection source pull tuner according to claim 10, wherein said transmission line is a slabline of characteristics impedance Z0.

14. A harmonic rejection source pull tuner according to claim 10, wherein said at least one moveable shorted-stub is a coaxial resonator of characteristics impedance Z0/2 and has a length approximately equal to $\lambda/2$ at nF0.

15. A harmonic rejection source pull tuner according to claim 10, wherein at least one of said at least one moveable shorted-stub further includes another resonator adapted to compensate the effect of the corresponding moveable shorted-stub on the reflection factor at the base frequency F0, said other resonator having a configuration identical to the corresponding moveable shorted-stub and being mechanically attached thereto.

16. A harmonic rejection source pull tuner according to claim 10, where said shorted-stubs grounding means are controlled by remote electrical means, said remote electrical means comprises at least one electrical motor.

* * * * *